United States Patent
Li et al.

(10) Patent No.: US 9,293,294 B1
(45) Date of Patent: Mar. 22, 2016

(54) FREQUENCY DEPENDENT CLOCK APPARATUS AND METHOD

(71) Applicant: TAIWAN SEMICONDUCTOR MANUFACTURING COMPANY LTD., Hsinchu (TW)

(72) Inventors: Shao-Yu Li, Hsinchu (TW); Tsung-Hsin Yu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/554,705

(22) Filed: Nov. 26, 2014

(51) Int. Cl.
  *H01J 37/147* (2006.01)
  *H01J 37/317* (2006.01)
  *H03K 5/14* (2014.01)
  *H03K 5/00* (2006.01)

(52) U.S. Cl.
  CPC ........... *H01J 37/147* (2013.01); *H01J 37/3177* (2013.01); *H03K 5/14* (2013.01); *H03K 2005/00013* (2013.01)

(58) Field of Classification Search
  USPC .................................................. 250/492.22
  See application file for complete search history.

(56) References Cited

U.S. PATENT DOCUMENTS

2006/0041803 A1\* 2/2006 Woodward ......... G01R 31/3177
  714/724

\* cited by examiner

*Primary Examiner* — Kiet T Nguyen
(74) *Attorney, Agent, or Firm* — WPAT, P.C.; Anthony King

(57) ABSTRACT

A method for operating a dynamic pattern generator (DPG) has a mirror array, where an operating clock of the DPG is received and converted to a toggling rate dependent on the operating clock. The toggling rate is compared with a threshold. If the toggling rate is greater than the threshold, the method partitions the mirror array into a plurality of groups. In response to the groups, the method determines a delay value based on the operating clock. The method further generates a delayed clock with the delay with respect to the first clock to the groups of the mirror array.

20 Claims, 12 Drawing Sheets

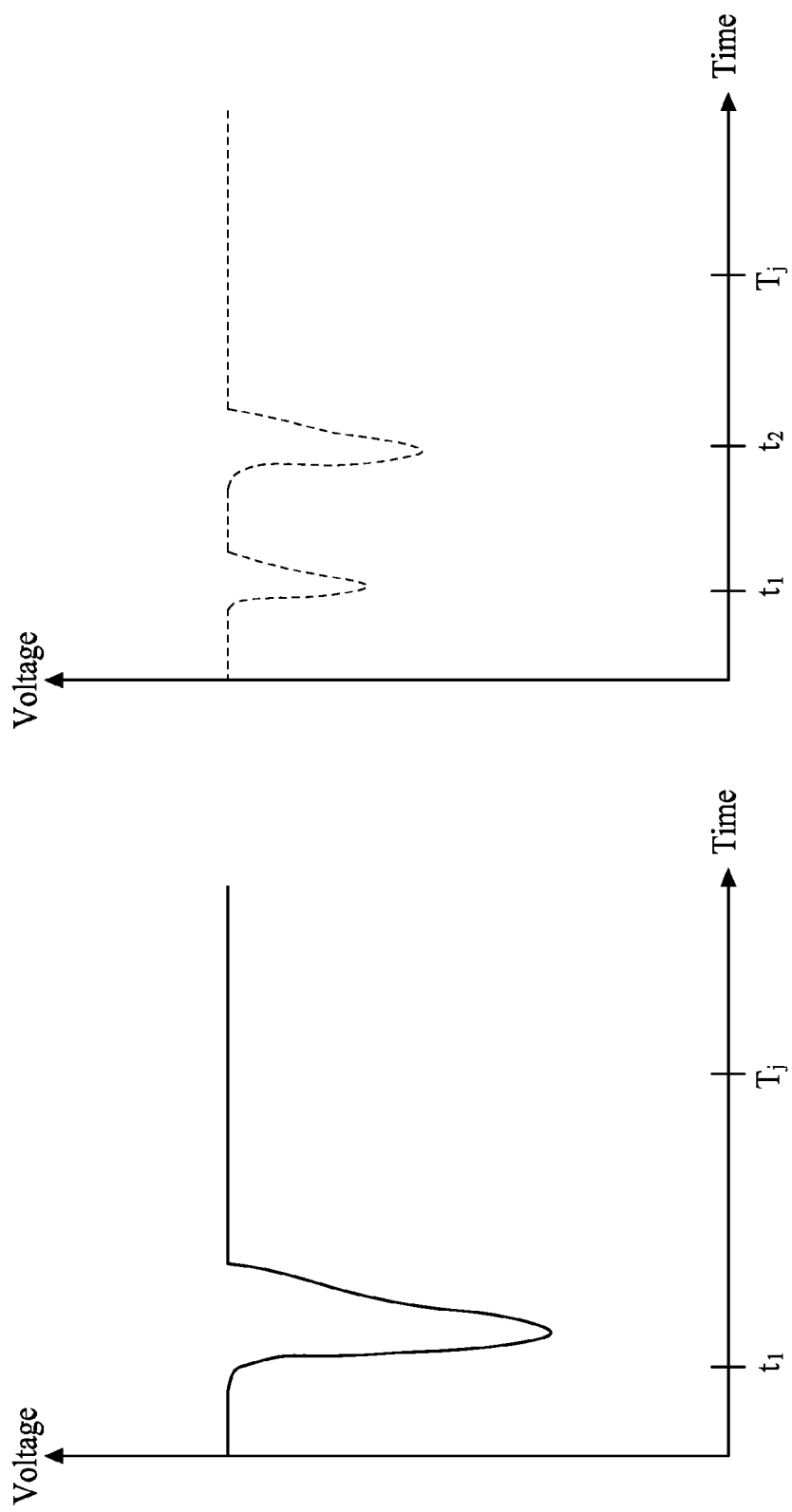

FREQUENCY DEPENDENT CLOCK APPARATUS AND METHOD

BACKGROUND

In reflective electron beam lithography, a dynamic pattern generator (DPG) is utilized to deliver exposure patterns. The DPG includes an array of mirror cells. In a process for patterning a wafer, some mirror cells in the array may absorb electrons, while the other mirror cells may reflect electrons back to the wafer. As the wafer size continues to increase, the dimension of the mirror array increases as well. DPGs are required to meet the high throughput requirement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A and 6B are schematic diagrams showing a voltage drop associated with a DPG, in accordance with some embodiments.

DETAILED DESCRIPTION

Figure 1:
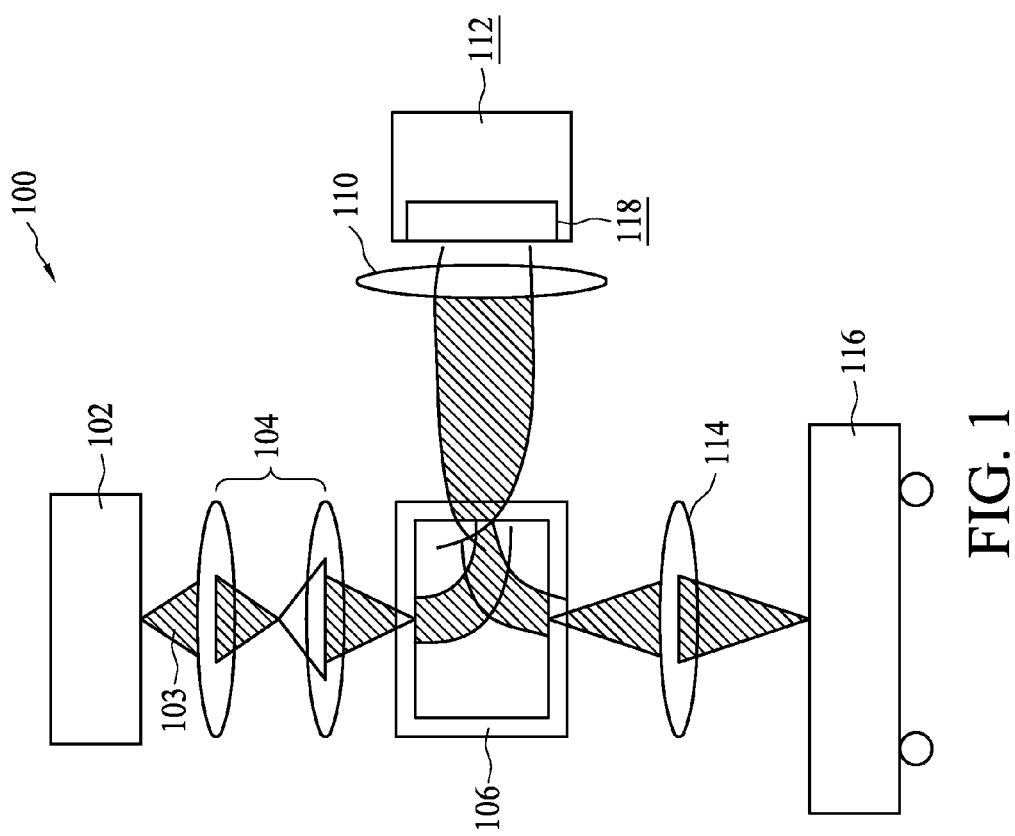
FIG. 1 is a schematic diagram of a reflective electron beam lithography system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram of a reflection electron beam lithography system 100, in accordance with some embodiments of the present disclosure. Referring to FIG. 1, system 100 includes an electron source 102, illumination electron-optics 104, a magnetic prism 106, an objective electron lens 110, a dynamic pattern generator (DPG) 112, projection electron-optics 114, and a stage 116.

Electron source 102 emits an electron beam 103 toward illumination electron-optics 104. Illumination optics 104 collimates electron beam 103 emitted by electron source 102 and determines the current setting of electron beam 103 for illuminating DPG 112. Magnetic prism 106 applies a force upon incident electrons of electron beam 103 and directs electron beam 103 towards objective lens 110 and DPG 112. Objective optics 110 decelerates and focuses the incident electrons of electron beam 103.

DPG 112 absorbs or reflects the approaching electrons of electron beam 103 based on configured patterning data for exposure. DPG 112 includes a mirror array 118 composed of mirror cells (pixels). Each mirror cell includes a register for receiving the patterning data, and a metal pad coupled to a voltage output controlled by the register. The electrons in electron beam 103 are reflected from or absorbed by DPG 112 dependent on the applied voltage on the metal pad.

As the reflected electrons leave DPG 112, they are reaccelerated and passed through magnetic prism 106. Magnetic prism 106 receives the reflected electrons and directs the reflected electrons towards projection optics 114 downward. Projection electron-optics 114 focuses and demagnifies incoming electron beam 103 onto a photoresist on a wafer held on the stage 116.

Moreover, DPG 112 receives the patterning data and exposes the lithographic pattern through mirror array 118. The incident electrons are either reflected backward from or absorbed by the corresponding mirror cells according to the controlled voltages applied to the cells. Therefore each of the mirror cells act like an "on-off" switch to represent the binary value of a corresponding pixel in the patterning data.

DPG 112 is required to operate at a high data rate in order to support advanced reflective electron beam lithography systems. The data rate may be up to several trillion bits per second. Therefore, a mirror array 118 is usually equipped with more than one million mirror cells. Each time the exposure pattern is updated, the patterning data are sent to the registers of mirror cells in advance. The mirror cells perform data change in the register outputs. DPG 112 can then handle exposing periods and update rates of patterning in response to a clock signal. When a cell experiences change of binary patterning data from an 'on' state to 'off' state or vice versa (i.e., toggling operation), a temporary current flow among circuit nodes is observed. The transient current flow along with circuit resistance leads to a temporary voltage drop. It should be noted that when a considerable number of mirror cells perform toggling operations at the same time, the accumulated current flow may incur an effect called "dynamic IR (voltage) drop". The dynamic IR drop may cause mirror cells to operate below normal working voltages and thus deteriorate cell function.

Dynamic IR drop results from the current fluctuation during a transient state of toggling before the togging reaches a steady state. The reduced voltage due to dynamic IR drop is attributed to the presence of toggling and is thus not stable. Obviously, it is not effective to compensate for that reduced voltage by adding a constant voltage level. Alternatively, in an existing approach to alleviate the dynamic IR drop, decoupling capacitors are disposed in the vicinity of mirror cells to provide a compensation current during a transient period of a toggling operation. However, the area consumption and position limitation of decoupling capacitors make it difficult to incorporate additional capacitors into a dense circuitry like DPG 112.

It is observed that the phenomenon of dynamic IR drop would become worse when the number of cells simultaneously performing the toggling operation grows. Moreover, the number of cells simultaneously performing the toggling operation is dependent on either the size of mirror array 118 or the percentage of toggled mirror cells. In the present disclosure, toggling rate is defined as the number of cells performing toggling operation to the number of cells in mirror array 118. Since the size of mirror array 118 does not change with time, toggling rate is therefore more suitable to be relied upon in evaluating the extent of dynamic IR drop. In addition, toggling rate can be obtained from the pattering data before each exposing process is performed. Consequently, estimation and management of dynamic IR drop for DPG 112 can be achieved based on toggling rate.

Figure 2:
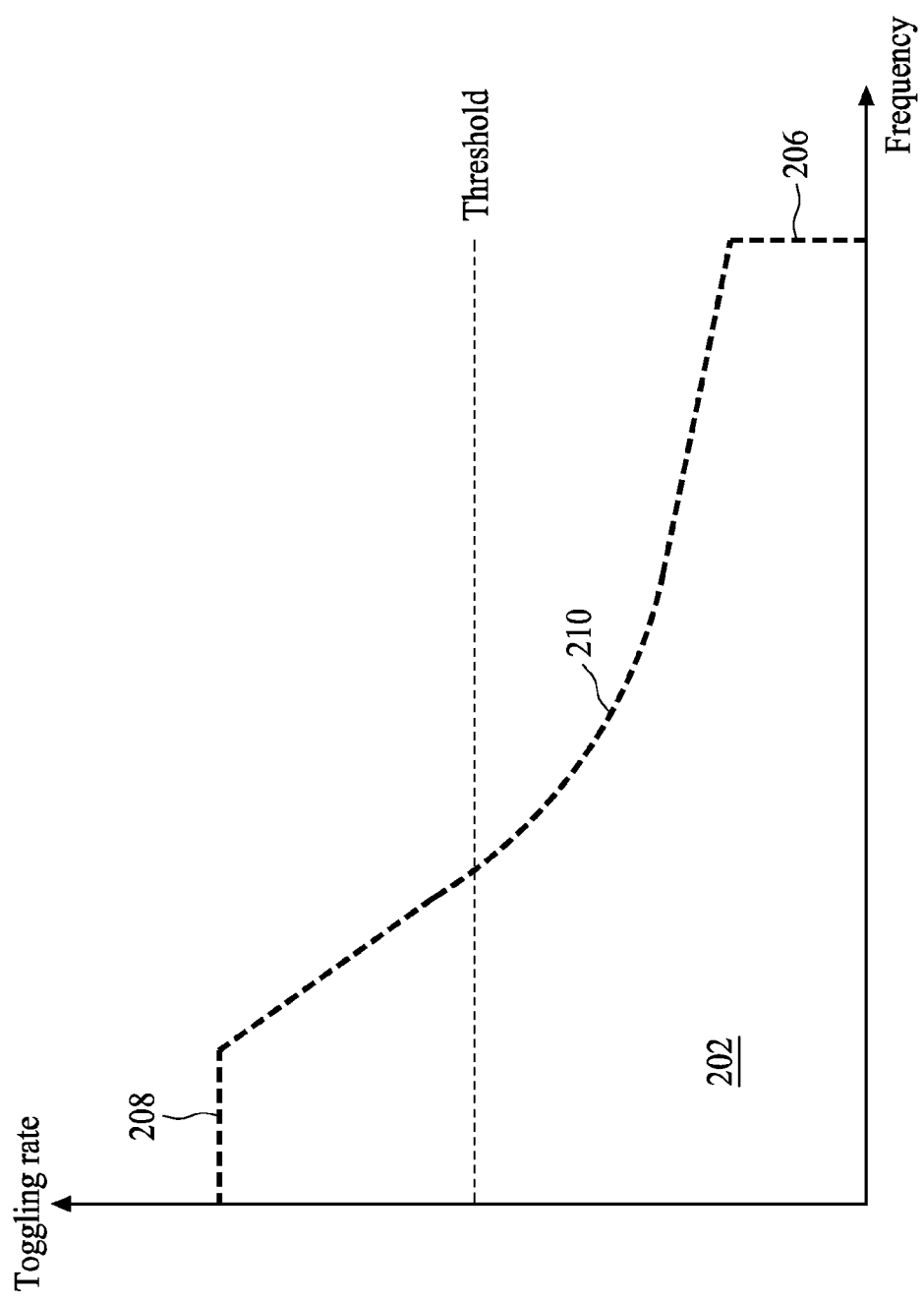
FIG. 2 is a diagram showing toggling rates at different frequencies for a dynamic pattern generator (DPG), in accordance with some embodiments.

FIG. 2 is a diagram showing toggling rates at different frequencies for DPG 112, in accordance with some embodiments. In FIG. 2 the x-axis represents the frequency of an operating clock, and the y-axis represents the toggling rate of mirror array 118. An operation area 202 represents the operation specification for the toggling rate and frequency. In each DPG operation, the clock frequency and the toggling rate for an exposing period fall within operation area 202. Operation area 202 is defined by a line 206 (representing a frequency limit), a line 208 (representing a togging rate limit) and a curve 210. In an embodiment, the toggling rate limit is determined by an equation below:

$$R*F=C$$

where R denotes the toggling rate, F denotes the clock frequency, and C denotes a constant.

Although in some embodiments operation area 202 may take a different form, the operation specification requires that the operating clock increases as the toggling rate decreases. Also, the specification requires that the toggling rate increases as the operating clock decreases. As a result, DPG 112 is allowed to operate at higher toggling rates (which mean a higher risk of dynamic IR drop) at lower frequencies.

To address the dynamic IR drop issue, mirror cells that would otherwise simultaneously be toggled are separately toggled at different time instants in response to separate clocks. Consequently, more than one clock signals are required for toggling different portions of mirror array 118 at different time points. Moreover, the delay between time points in sending the clock signals needs to be taken into consideration because different clock settings may complicate the timing control of the operation in DPG 112. In an embodiment, if the toggling rate is smaller than or equal to a threshold, the mirror cells in mirror array 118 are toggled in response to a single clock signal. If the toggling rate is greater than the threshold, a first group of the mirror cells in mirror array 118 is toggled in response to a first clock at a first time point, and a second group of mirror cells in mirror array 118 is then toggled in response to a second clock at a second time point that is lagged behind the first time point by a predetermined time of delay. The second clock, as compared to the first clock, is referred to as a delayed clock. Furthermore, the first time point and the second time point fall within a delay region, which will be discussed with reference to FIG. 3 below.

Figure 3:
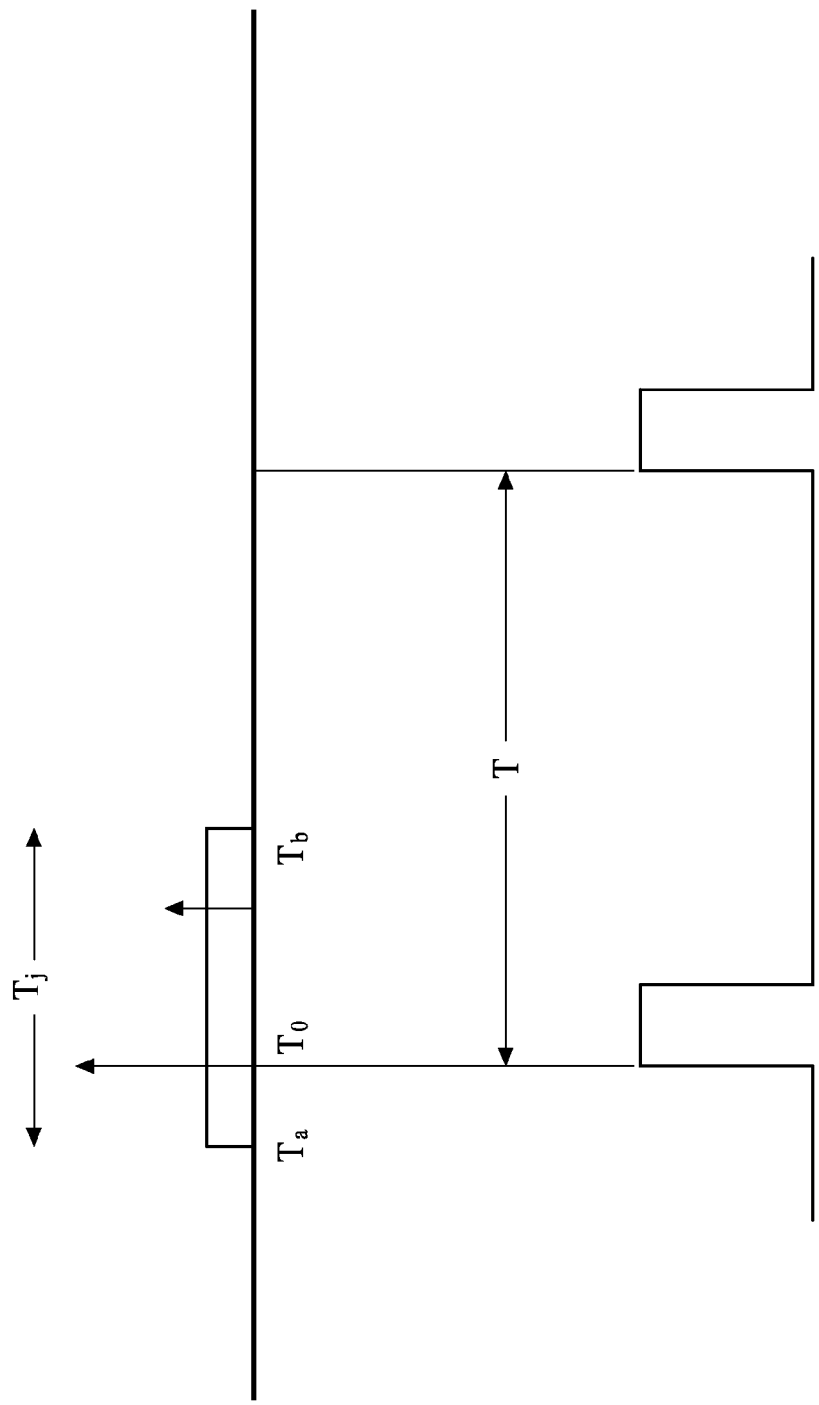
FIG. 3 is a diagram showing a clock signal, in accordance with some embodiments.

FIG. 3 is a diagram showing a clock signal, in accordance with one embodiment of the disclosure. Referring to FIG. 3, the clock signal has a period T. In an embodiment, DPG 112 triggers a toggling operation at a rising edge of the clock signal. Since a clock may drift over time due to environmental issues or unreliable circuit design, a clock jitter can be observed at clock output. In order to maintain normal circuit operation, a jitter margin Tj, during which the clock signal is allowed to perform normal triggering, is set. In FIG. 3, for example, the jitter margin Tj is illustrated as a portion of the period T. In an embodiment, the jitter margin Tj serves as a delay region for sending clock signals during a toggling operation. In some embodiments, the delay region is set to be a predetermined percentage or a portion of the period T of the operating clock. For example, the percentage is 5%, 10% or other suitable percentages. In the present embodiment, the jitter margin Tj spans from $T_a$ to $T_b$, and the predetermined percentage is expressed as $(T_b-T_a)/T \times 100\%$.

Figure 4:
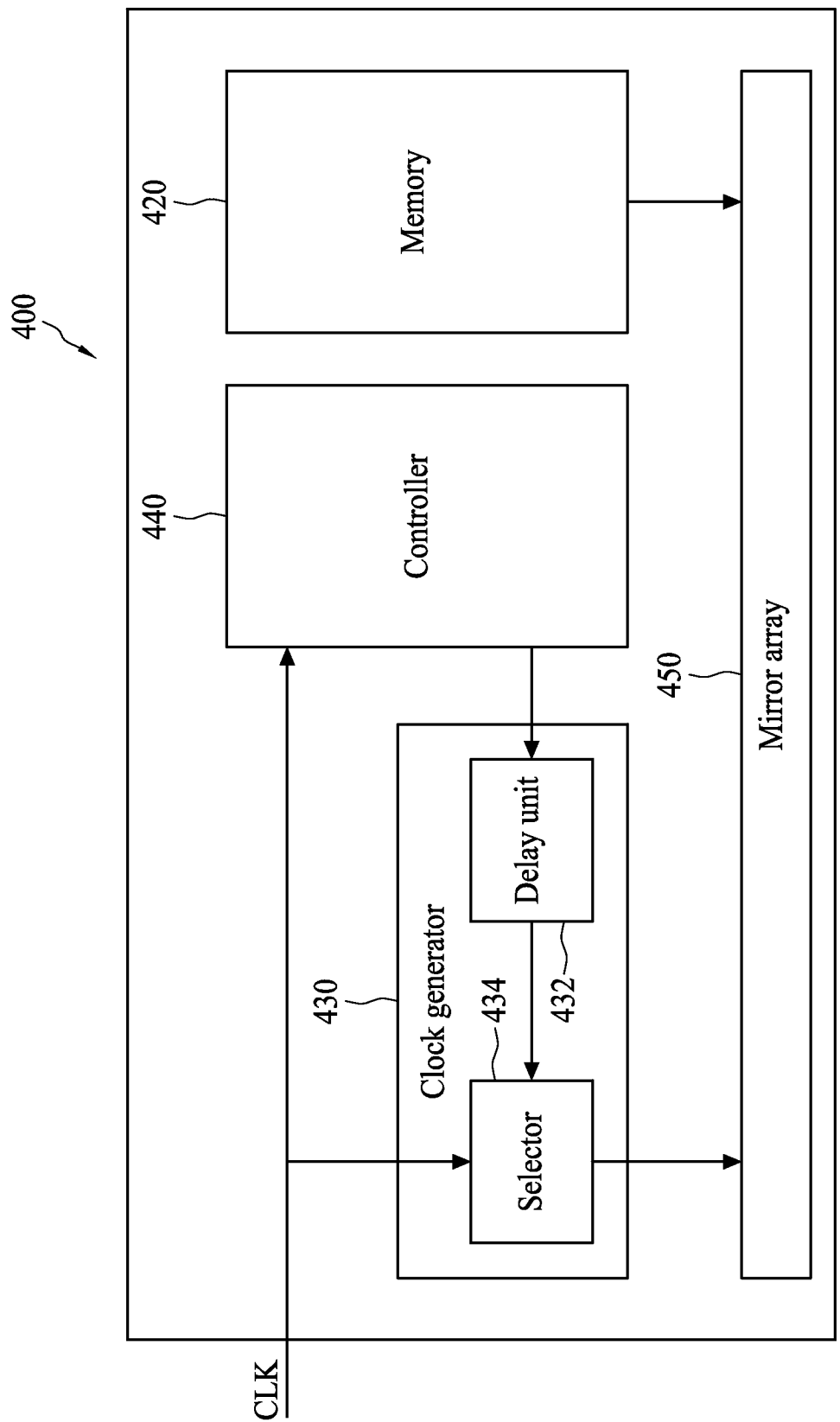
FIG. 4 is a block diagram of a DPG, in accordance with some embodiments.

FIG. 4 is a block diagram of DPG 400, in accordance with some embodiments of the disclosure. Referring to FIG. 4, DPG 400 includes a memory 420, a clock generator 430, a controller 440, and a mirror array 450. Details of elements in DPG 400 are described as follows.

Memory 420, coupled to mirror array 450, stores patterning data for use by mirror cells. Clock generator 430 is coupled to controller 440 and outputs a clock signal selected from an operating clock CLK or a delayed clock with a delay determined by controller 440. The clock output of clock generator 430 triggers mirror array 450 for a toggling operation. In an embodiment, clock generator 430 triggers one mirror cell at a time. In another embodiment, clock generator 430 triggers a group of mirror cells at a time.

Clock generator 430 includes a delay unit 432 and a selector 434. Delay unit 432 receives information on the delay from controller 440 and provides a delayed clock with the delay for triggering one cell or a group of mirror cells for a toggling operation. In an embodiment, delay unit 432 includes a digitally controlled delay line. The digitally controlled delay line is configured to provide delayed signal outputs with different delay increments.

Selector 434 selects a clock from the operating clock and the delayed clock. Selector 434 operates under two clock configurations, a uniphase clock configuration and a multiphase clock configuration. Under the uniphase clock configuration, the output of selector 434 toggles mirror array 450 with the operating clock in response to a comparison result that the toggling rate is smaller than or equal to the threshold. On the other hand, under the multiphase clock configuration, the output of selector 434 toggles, in response to a comparison result that the toggling rate is greater than the threshold, one mirror cell or a group of mirror cells of mirror array 450 with the operating clock while toggling another mirror cell or another group of mirror cells with the delayed clock.

Controller 440 provides a signal including information on the delay based on the period T of the operating clock and delivers the information to clock generator 430. Controller 440 is configured to determine which one of the uniphase or multiphase clock configuration is chosen. Controller 440 determines at least one nonzero delay when the multiphase clock configuration is chosen. The amount of delay (delay values) associated with the clock configurations will be discussed later.

Mirror array 450 receives the patterning data from memory 420 and a clock signal from clock generator 430 for toggling operations. In an embodiment, mirror array 450 is partitioned into mirror groups. Mirror cells in a same mirror group are toggled by a same clock signal.

Figure 5:
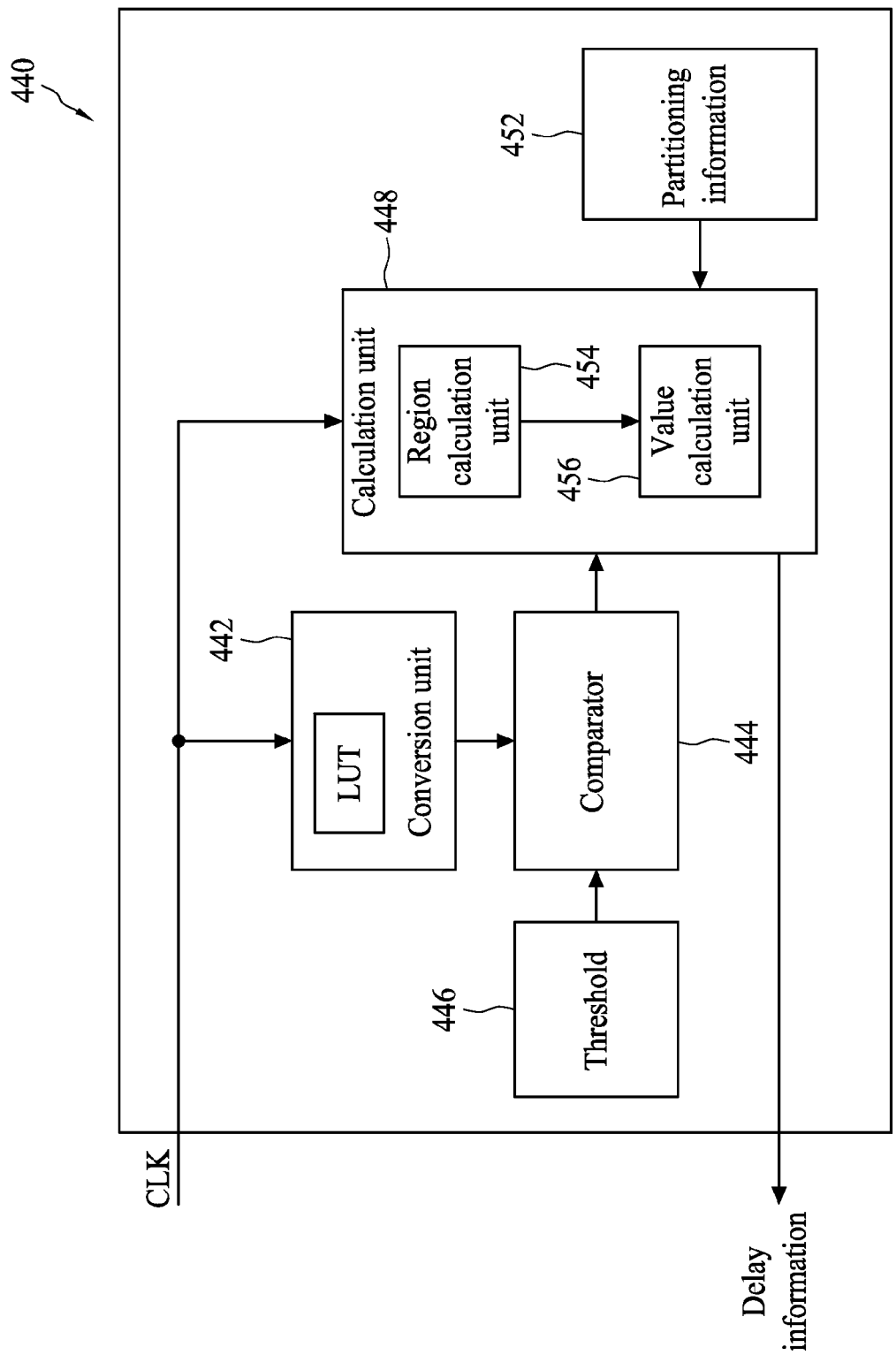
FIG. 5 is a block diagram of a controller of the DPG in FIG. 4, in accordance with some embodiments.

FIG. 5 is a block diagram of controller 440 of DPG 400, in accordance with some embodiments. Referring to FIG. 5, controller 440 provides a signal including information on the delay. Controller 440 includes a conversion unit 442, a comparator 444, and a calculation unit 448. Details of the elements are described as follows.

Also referring to FIG. 2, conversion unit 442 provides a toggling rate based on the frequency of the operating clock. In an embodiment, conversion unit 442 includes a look-up table (LUT) to store data associated with the curve 210 in FIG. 2, and determines a toggling rate that corresponds to the frequency of the operating clock in the look-up table. In another embodiment, conversion unit 442 includes logic circuits configured to determine a toggling rate based on the above-mentioned equation. The toggling rate determined by conversion unit 442 is sent to comparator 444.

Comparator 444 compares the toggling rate with a toggling threshold of the operating clock. The threshold serves as a quantitative index for assessing the extent of dynamic IR drop. If the toggling rate is greater than the predetermined threshold, dynamic IR drop is considered significant and may adversely affect the patterning result. In that case, a flag representing the multiphase clock configuration is sent to calculation unit 448 to perform separate toggling of mirror cells. On the other hand, if the toggling rate is equal to or smaller than the threshold, a flag representing the uniphase clock configuration is sent. For example, also referring to FIG. 2, when DPG 400 operates at a relatively low frequency so that the toggling rate exceeds the threshold, comparator 444 selects the multiphase clock configuration. On the other hand, when DPG 400 operates at a relatively high frequency, comparator 444 selects the uniphase clock configuration. In an embodiment, controller 440 includes a memory 446 for storing the threshold.

If comparator 444 determines that the toggling rate is greater than threshold 212, a flag is sent to calculation unit 448. In response to the flag, calculation unit 448 generates delays for toggling mirror array 450 according to the multiphase clock configuration. In an embodiment, calculation unit 448 determines delay region Tj for sending clock signals at the different delays. As mentioned previously, delay region Tj in an embodiment is defined as a predetermined percentage or portion of the period T of the operating clock. It is noted that if the predetermined percentage or portion is kept unchanged, delay region Tj expands or shrinks as the period T of the operating clock. Therefore, the size of delay region Tj and hence the range of delay amount are adjustable according to the operating clock. In an embodiment, the number of delays and indexes for their corresponding mirror cell groups are provided to clock generator 430. The index associates a certain group of mirror cells with a delay for a toggling operation. It is desirable for calculation unit 448 to provide as more delays as possible if the size of delay region Tj permits. More delays means more groups available for toggling in mirror array 450 and thus more likely to alleviate dynamic IR drop effect.

In an embodiment, controller 440 includes a partitioning unit 452 coupled to calculation unit 448 and configured to provide partitioning parameters such as the number of groups and/or the indexes of the groups. In another embodiment, partitioning unit 452 is implemented by a memory storing the partitioning information. Calculation unit 448 determines the number of groups and provides the signal including information on the delays based on the partitioning parameters from partitioning unit 452.

Calculation unit 448 determines the delays, based on the operating clock, for the groups of mirror cells in response to a comparison result from conversion unit 442. In determining the delays, calculation unit 448 takes into account limitations in implementation, for example, the minimum delay, the number of total delays, the minimum delay separation, the maximum toggling rising time of cells, the maximum toggling falling time of cells, the maximum dynamic IR drop, and the maximum group number. As the number of delays is determined, the number of groups of mirror cells is determined.

In another embodiment, DPG 400 partitions mirror cells according to a predetermined partitioning configuration. Moreover, the number of group provided by partitioning unit 452 is predetermined. In some situations, however, calculation unit 448 may not provide a sufficient number of delays for a desired number of groups due to the limitations mentioned above. As a result, the number of delays is smaller than the number of groups. In that case, in some embodiments, calculation unit 448 is configured to provide a signal including information on how a smaller number of delays is assigned to a larger number of groups. For example, a same delay is assigned to one or more groups. Accordingly, calculation unit 448 is configured to support the multiphase clock configuration for DPG 400 by integrating several smaller groups into a bigger group. In an embodiment, the information such as final number of available delays included in the signal provided by calculation unit 488 is different from the number of groups provided by partitioning unit 452. Then the number of mirror cell groups and mirror cell indexes according to the delays from calculation unit 488 are provided.

Furthermore, calculation unit 448 includes a region calculation unit 454 and a value calculation unit 456. Region calculation 454 determines a delay region based on the period T of the operating clock. Value calculation unit 456 receives the delay region form region calculation unit 454 and determines delay values for delaying the operating clock. In determining the delay values, delay calculation unit 456 is configured to take into consideration the above-mentioned limitations in implementation.

Effectively, controller 440 provides a signal including information on the delays for the delayed clocks. Conversion unit 442 determines the toggling rate based on the frequency of the operating clock. Comparator 444 compares the toggling rate with the threshold. Calculation unit 448 provides the delay values in response to a comparison result from comparator 444. Region calculation unit 454 determines a delay region based on the period T of the operating clock and value calculation 456 provides the delay values based on the delay region.

FIGS. 6A and 6B are schematic diagrams showing a voltage drop associated with DPG 400, in accordance with some embodiments. Referring to FIG. 6A, a line 602 represents a dynamic IR drop when DPG 400 operates according to the uniphase clock configuration. In this case, all of the cells in mirror array 450 perform the toggling operation at the same time. The node current produced from mirror cells leads to a noticeably transient voltage drop at time instant $t_1$ in the toggling operation.

Referring to FIG. 6B, a dotted line 604 represents a dynamic IR drop when DPG 400 operates according to a two-phase clock configuration. The mirror cells are grouped and toggled at two separate time instants. The two groups may not have the same size. Although the phenomenon of voltage drop is still present, the impact of voltage plunge is effectively alleviated due to the separate toggling operations at time $t_1$ and time $t_2$ within jitter margin Tj. The huge voltage spike in the uniphase clock configuration is split into two distributed, smaller spikes in the two-phase clock configuration. In an embodiment, the magnitude of the IR drop in the uniphase configuration is equal to the sum of the magnitudes of individual smaller spikes in the two-phase clock configuration.

Figure 7A:
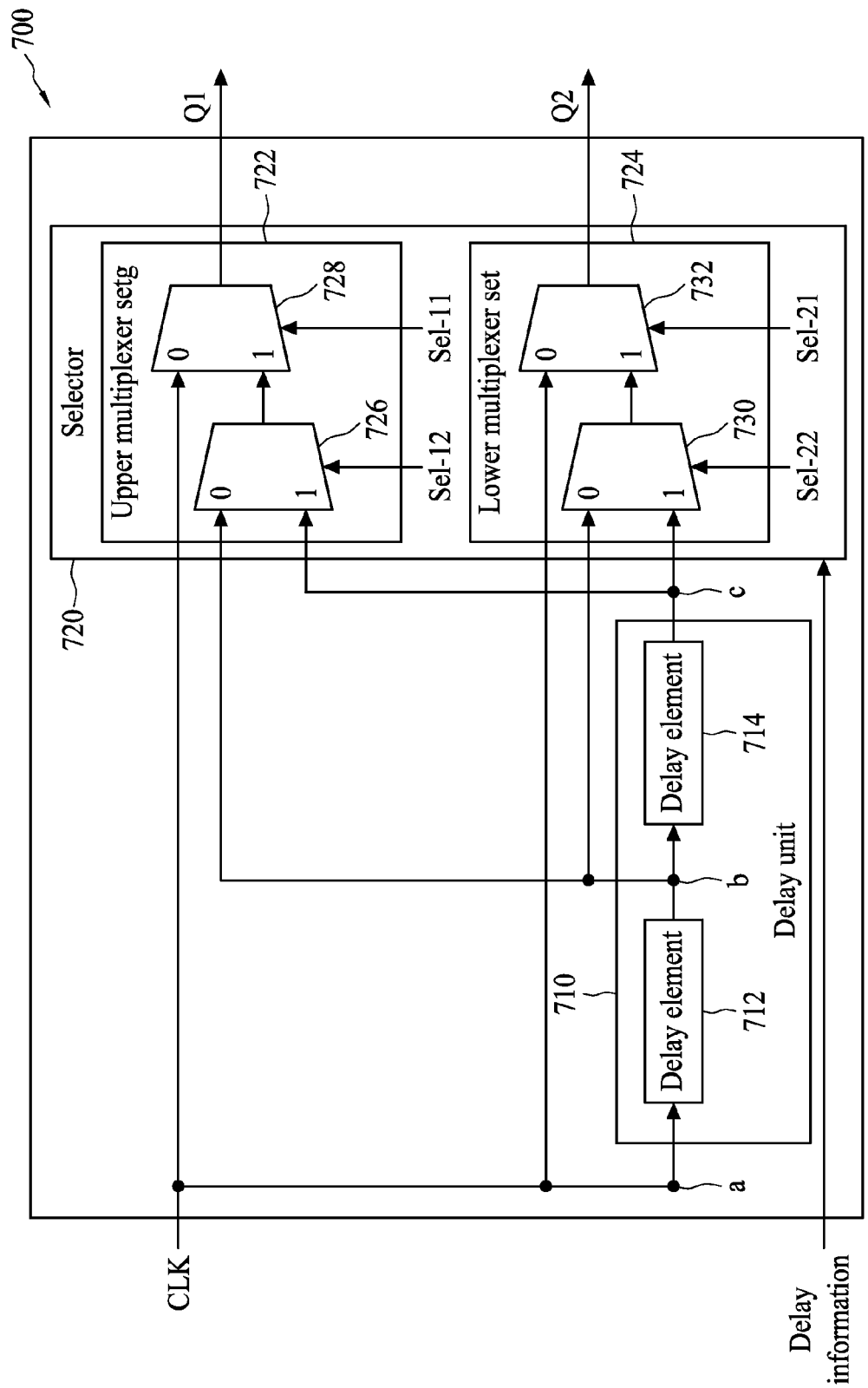
FIG. 7A is a block diagram of a clock generator, in accordance with some embodiments.

FIG. 7A is a block diagram of clock generator 700, in accordance with some embodiments of the disclosure. Compared to clock generator 430 in FIG. 4, clock generator 700 includes a delay unit 710 and a selector 720.

Delay unit 710 receives the delays from controller 440, and includes two delay elements 712 and 714. Both of delay elements 712 and 714 are configured to modulate the incoming clock with a predetermined delay $T_d$. Therefore, the clocks at nodes a, b, and c are a clock without delay, a clock with a delay of $T_d$, and a clock with a delay of $2*T_d$, respectively. It should be noted that $T_d$ is determined such that $2*T_d$ does not exceed jitter margin Tj. In an embodiment, delay unit 710 includes a delay line of more than one delay elements. In another embodiment, the delay line includes a digitally controlled delay line.

Selector 720 receives the clocks with different delay values from delay unit 710 and selects an output clock from the operating clock or an output of delay unit 710. Selector 720 includes an upper multiplexer set 722 and a lower multiplexer set 724 to select the clock. Upper multiplexer set 722 includes multiplexers 726 and 728 and provides an output Q1. Lower multiplexer set 724 includes multiplexers 730 and 732 and provides an output Q2. Multiplexer 726 is a 2-to-1 multiplexer and includes a select port to receive a select signal Sel-11. Multiplexer 728 is a 2-to-1 multiplexer and includes a select port to receive a select signal Sel-12. Multiplexer 730 is a 2-to-1 multiplexer and includes a select port to receive a select signal Sel-21. Moreover, multiplexer 732 is a 2-to-1 multiplexer and includes a select port to receive a select signal Sel-22. In response to select signals Sel-11 and Sel-12, a clock signal is provided to mirror array 450 through output Q1. The clock signal from upper multiplexer set 722 is one of the clock without delay, the clock with a delay of $T_d$, and a clock with a delay of $2*T_d$. Likewise, in response to select signals Sel-21 and Sel-22, a clock signal is provided to mirror array 450 through output Q2. The clock signal from lower multiplexer set 722 is one of the clock without delay, the clock with a delay of $T_d$, and a clock with a delay of $2*T_d$.

Figure 7B:
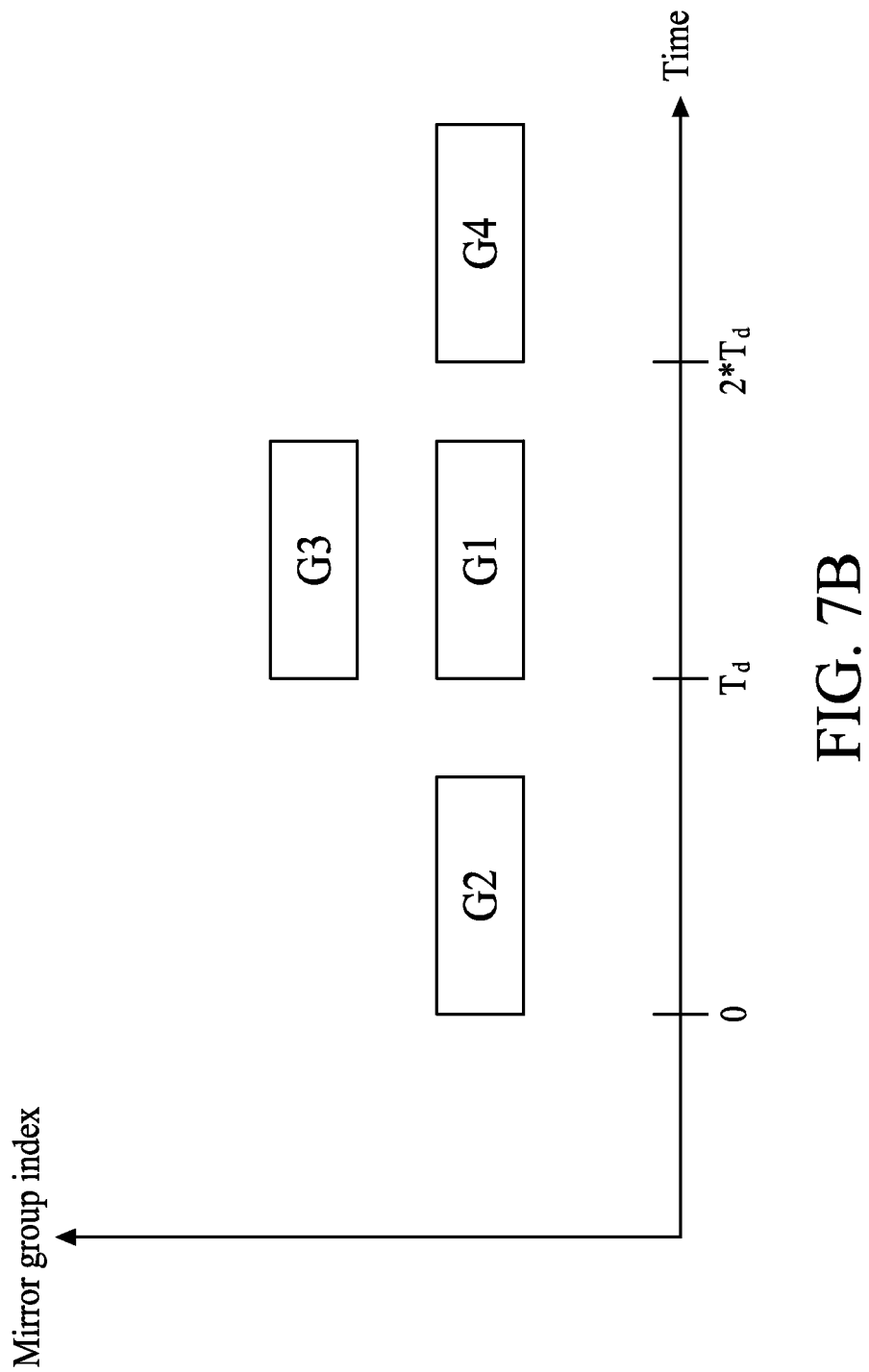
FIG. 7B is a diagram showing toggling timing for mirror groups, in accordance with some embodiments.

FIG. 7B is a diagram showing toggling timing for mirror groups, in accordance with some embodiments. Referring to FIG. 7B, mirror array 450 is partitioned into four groups (G1 through G4). In this case two identical clock generators 700 in FIG. 7A are required to provide four clock outputs for their respective groups G1 to G4. When the delays for the four groups are determined, select signals Sel-11, Sel-12, Sel-21, and Sel-2 under the control of controller 440 are generated to provide delays according to the timing configuration in FIG. 7B. In the present embodiment, the toggling time instants for the groups G1 through G4 are selected as $T_d$, 0, $T_d$, $2*T_d$, respectively, as illustrated in FIG. 7B. As mentioned above, the toggling time instants are determined such that $2*T_d$ does not exceed jitter margin Tj. As a result, group G2 is toggled in response to a first clock without delay, groups G1 and G3 are simultaneously toggled in response to a second clock lagged behind the first clock by the delay amount of $T_d$, and group G4 is toggled in response to a third clock lagged behind the first clock by a delay amount of $2*T_d$. Moreover, the logic states of select signals are (Sel-11, Sel-12)=(1,0) for the group G1, (Sel-21, Sel-22)=(0,x) for the group G2, (Sel-11, Sel-12)=(1, 0) for the group G3, and (Sel-21, Sel-22)=(1,1) for the group G4. The notation 'x' in select signal Sel-22 for mirror group G2 represents a "don't care" situation, which means select signal Sel-21 overrides select signal Sel-22, irrespective of the logic state of select signal Sel-22.

Figure 8:
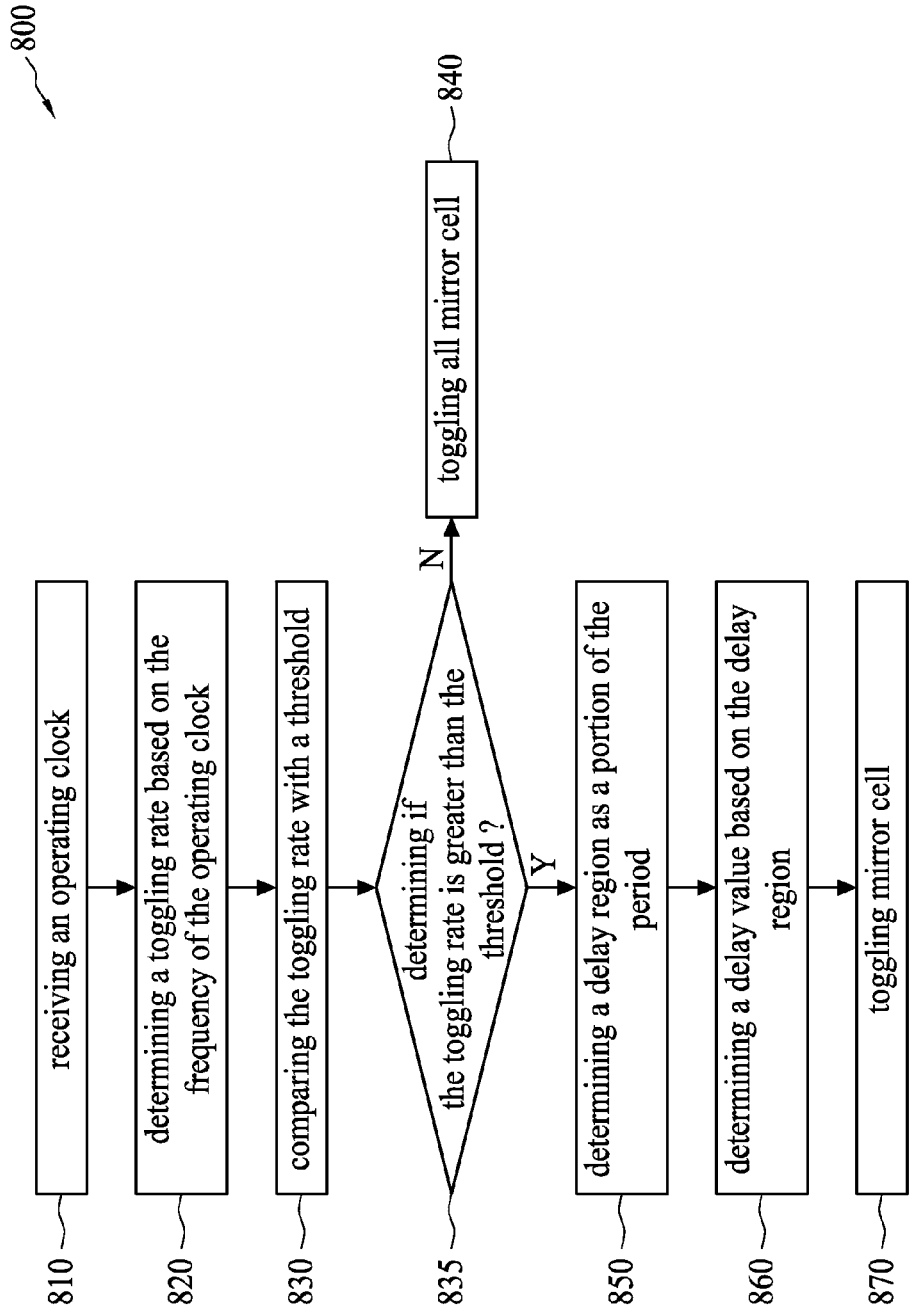
FIG. 8 is a flow diagram of a method for operating a DPG, in accordance with some embodiments.

FIG. 8 is a flow diagram of a method for operating DPG 400, in accordance with some embodiments of the disclosure. Referring to FIG. 8, in operation 810, when DPG 400 is activated, an operating clock is received.

In operation 820, a toggling rate is determined based on the frequency of the operating clock. In an embodiment, the toggling rate (denoted as R) and the frequency (denoted as F) observe an equation: $R*F=C$. In another embodiment, the toggling rate is determined by identifying the toggling rate associated with the frequency of the operating clock in a look-up table.

In operation 830, the toggling rate is compared with a threshold. The threshold is a predetermined value or an adjustable parameter. The threshold may represent a theoretical toggling rate for a tolerable dynamic IR drop.

In operation 835, it is determined whether the toggling rate is greater than the threshold. If not, the toggling rate is smaller than or equal to the threshold, a uniphase clock configuration is selected. Accordingly, in operation 840, all mirror cells in mirror array 450 are toggled in response to the operating clock without delay.

If affirmative, a multiphase clock configuration is selected. Accordingly, the mirror cells are toggled by groups in response to clock signals provided at different time points within a delay region. In operation 850, the delay region is determined based on the period of the operating clock. For example, the delay region is set as a predetermined percentage or portion of the period of the operating clock. In another embodiment, a jitter margin of the operating clock serves as the delay region.

In operation 860, at least one delay value based on the period of the operating clock for delaying the operating clock is determined. Moreover, mirror array 450 is partitioned into groups.

In operation 870, the cells in a partitioned group are toggled in response to a clock, and the cells in another partitioned group are toggled in response to another clock. One of the clocks is delayed with respect to the other clock by one of the at least one delay value.

Figure 9:
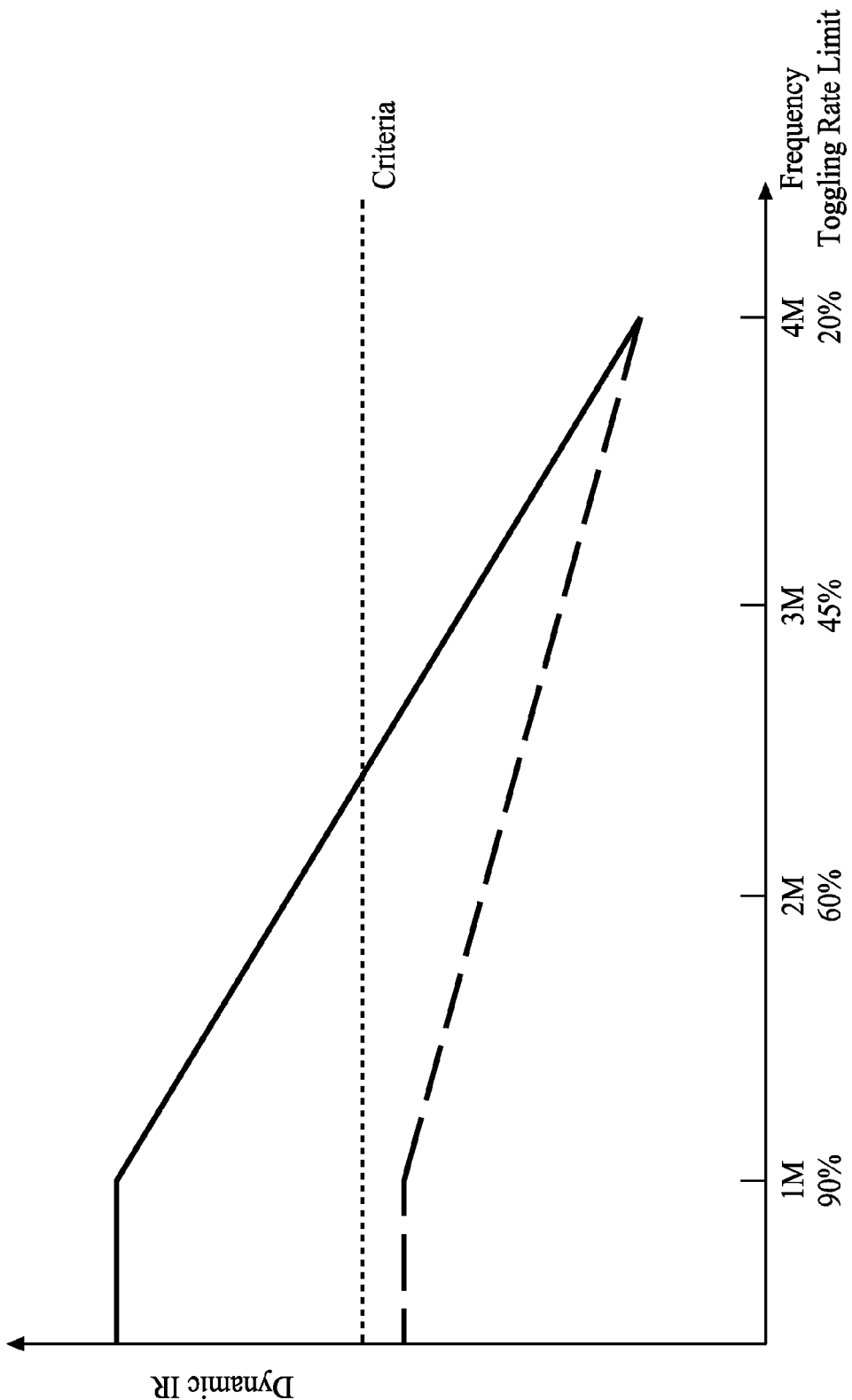
FIG. 9 is a diagram showing simulation results of dynamic IR drop, in accordance with some embodiments.

FIG. 9 is a diagram showing simulation results of dynamic IR drop, in accordance with some embodiments of the disclosure. Referring to FIG. 9, the simulation is conducted at clock frequencies from 1 MHz through 4 MHz. Toggling rates determined in operation 820 are also labeled along with frequencies. As shown in FIG. 9, dynamic IR drop in a method according to the present disclosure, as indicated in a dashed line, is significantly lower than that in some existing approaches, as indicated in a solid line. Moreover, in the existing approaches, dynamic IR rate exceeds an electrical criteria, which may not be acceptable in an advanced reflection electron beam lithography system.

Figure 10:
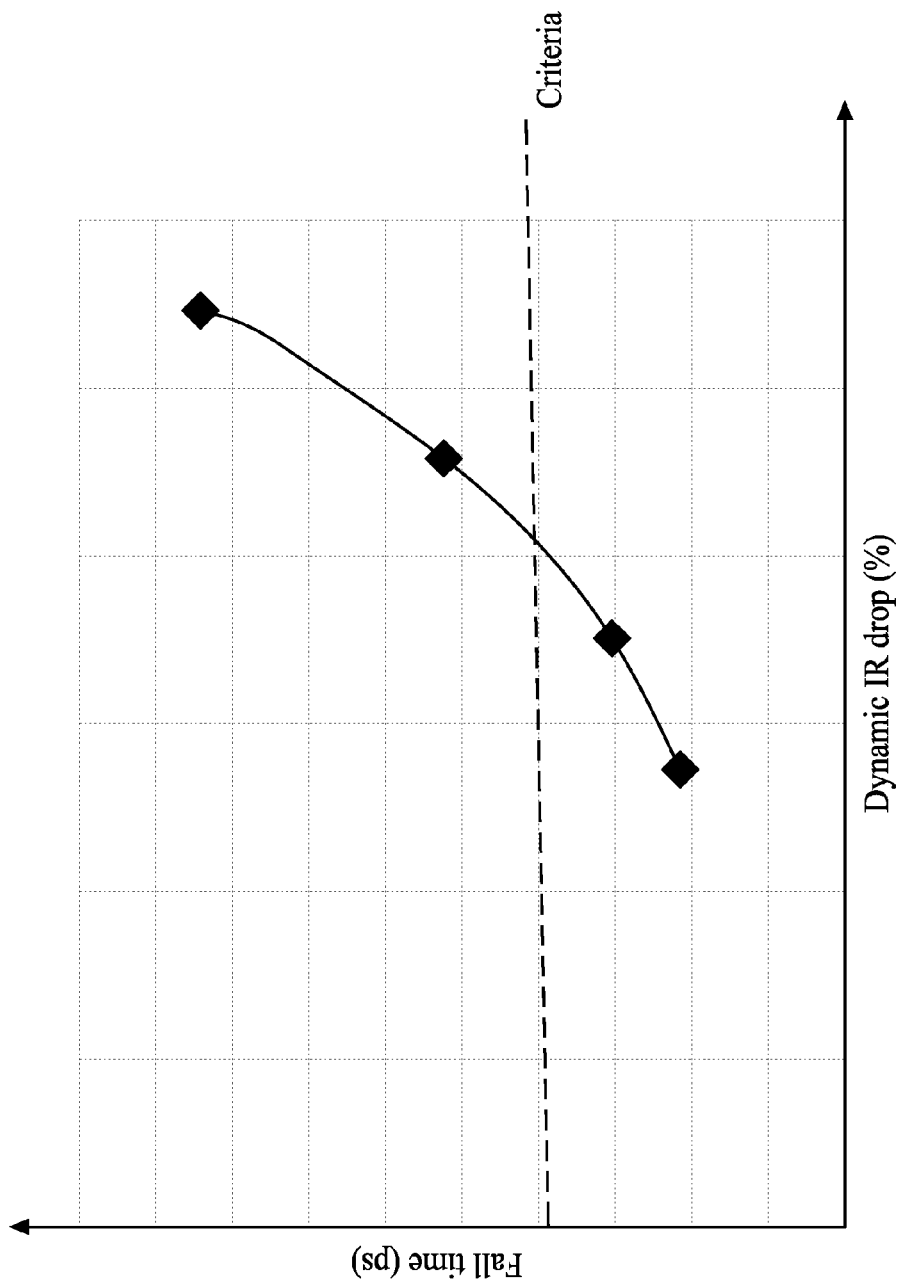
FIG. 10 is a diagram showing simulation results of cell falling time at different dynamic IR drop levels, in accordance with some embodiments.

FIG. 10 is a diagram showing simulation results of cell falling time at different dynamic IR drop levels, in accordance with some embodiments of the disclosure. FIG. 10 shows that cell falling time decreases as dynamic IR drop decreases. The falling time (the same for the rising time) is a period of time required for toggling mirror cells in a toggling operation. A decreasing falling time means a faster toggling operation. Effectively, since dynamic IR drop in the method according to the present disclosure is controlled below a criteria, the falling time can also be controlled below a criteria.

Figure 11B:
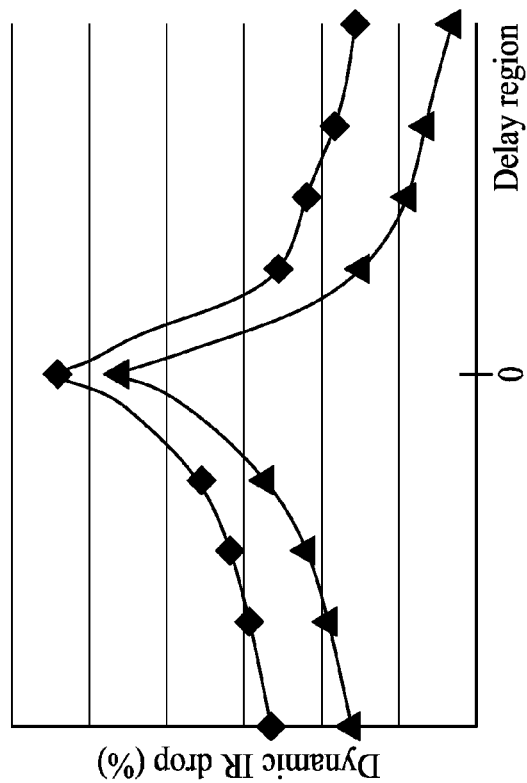
FIG. 11B is a diagram showing simulation results of dynamic IR drop at different delay region sizes, in accordance with some embodiments.
Figure 11A:
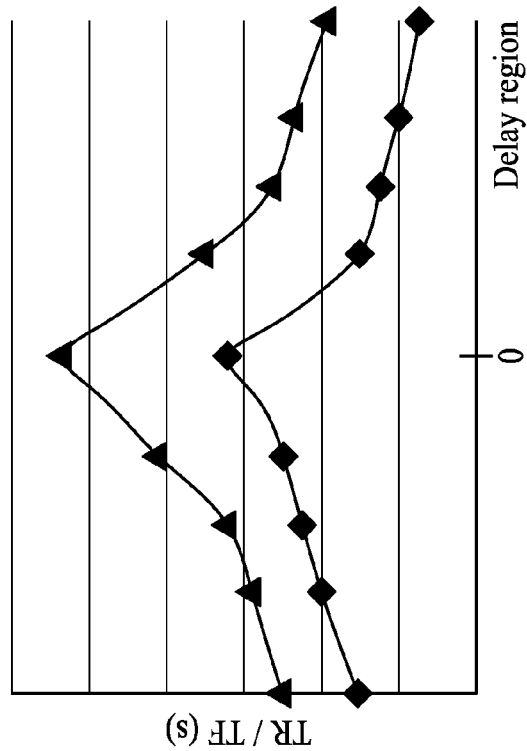
FIG. 11A is a diagram showing simulation results of cell falling (rising) time at different delay region sizes, in accordance with some embodiments.

FIG. 11A is a diagram showing simulation results of cell falling (rising) time at different delay region sizes, in accordance with some embodiment of the disclosure. The size of a delay region expands as the delay region moves away from the reference point "0" on both sides of the horizontal axis. Referring to FIG. 11A, cell falling time decreases as delay region increases in a method according to the present disclosure (the lower curve) and in some existing approaches (the upper curve). Nevertheless, the method according to the present disclosure has a shorter falling time than the existing approach.

FIG. 11B is a diagram showing simulation results of dynamic IR drop at different delay region sizes, in accordance with some embodiments. Referring to FIG. 11B, dynamic IR drop decreases as delay region increases in a method according to the present disclosure (the lower curve) and in some existing approaches (the upper curve). Nevertheless, the method according to the present disclosure has a smaller dynamic IR drop than the existing approach.

In some embodiments, in a method for operating a dynamic pattern generator (DPG) an operating clock having a frequency and a period is received. A toggling rate is determined based on the frequency of the operating clock. The toggling rate is compared with a threshold. The method provides a signal including information on a delay for the operating clock based on the period of the operating clock in response to a result of the comparing.

In some embodiments, in a method for operating a dynamic pattern generator (DPG), an operating clock having a period is received. A delay region based on the period of the operating clock is determined where the length of the delay region is a percentage or portion of the period of the operating clock. A signal including information on a delay for the operating clock based on the delay region is provided.

In some embodiments, a dynamic pattern generator (DPG) includes a controller. The controller provides a signal including information on a delay. The controller includes, a conversion unit configured to provide a toggling rate based on the operating clock, a comparator configured to compare the toggling rate with a threshold, and a calculation unit configured to determine the delay, based on the operating clock, for the operating clock in response to a comparison from the comparison result.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for operating a dynamic pattern generator (DPG), the method comprising:
   receiving a first clock having a frequency and a period;
   determining a toggling rate based on the frequency of the first clock;
   comparing the toggling rate with a threshold; and
   providing a signal including information on a delay for the first clock based on the period of the first clock in response to a result of the comparing.

2. The method according to claim 1, wherein the DPG includes a mirror array, further comprising toggling the mirror array with the first clock in response to a comparison result that the toggling rate is smaller than the threshold.

3. The method according to claim 1, wherein the DPG includes a mirror array, further comprising toggling a first group of the mirror array with a second clock in response to a comparison result that the toggling rate is greater than the threshold, the second clock being delayed with respect to the first clock by the delay.

4. The method according to claim 3 further comprising toggling a second group of the mirror array with the first clock in response to a comparison result that the toggling rate is greater than the threshold.

5. The method according to claim 1, wherein providing a signal including information on a delay further comprises determining a delay region based on the period of the first clock and determining a delay value for delaying the first clock.

6. The method according to claim 5, wherein determining a delay region further comprises setting a portion of the period of the first clock as the delay region.

7. The method according to claim 1, wherein determining a toggling rate includes identifying a toggling rate associated with the frequency of the first clock in a look-up table.

8. A method for operating a dynamic pattern generator (DPG), the method comprising:
   receiving a first clock having a period;
   determining a delay region based on the period of the first clock, the length of the delay region being a portion of the period of the first clock; and
   providing a signal including information on a delay for the first clock based on the delay region.

9. The method according to claim 8, wherein the DPG includes an array of mirror cells, wherein providing a signal further comprises determining the number of groups of the mirror cells, and providing the signal including information on a delay based on the number of groups.

10. The method according to claim 8, wherein the DPG includes a mirror array, further comprising toggling the mirror array with the first clock in response to a comparison result that a toggling rate is smaller than a threshold.

11. The method according to claim 10, wherein the first clock has a frequency, further comprising determining the toggling rate based on the frequency of the first clock.

12. The method according to claim 8, wherein the DPG includes a mirror array, further comprising toggling a first group of the mirror array with a second clock in response to a comparison result that a toggling rate is greater than a threshold, the second clock being delayed with respect to the first clock by the delay.

13. The method according to claim 12 further comprising toggling a second group of the mirror array with the first clock in response to a comparison result that the toggling rate is greater than the threshold.

14. The method according to claim 8, wherein determining a delay region further comprises comparing a toggling rate with a threshold, and determining the delay region in response to a comparison result that the toggling rate is greater than the threshold.

15. A dynamic pattern generator (DPG), comprising:
a controller configured to provide a signal including information on a delay, the controller comprising:
a conversion unit configured to provide a toggling rate based on the frequency of a first clock;
a comparator configured to compare the toggling rate with a threshold; and
a calculation unit configured to determine the delay, based on the first clock, for the first clock in response to a comparison result from the conversion unit.

16. The DPG according to claim 15, wherein the calculation unit further comprises a region calculation unit configured to determine a delay region based on the period of the first clock, and a value calculation unit configured to determine a delay value for delaying the first clock.

17. The DPG according to claim 15, wherein the conversion unit includes a look-up table.

18. The DPG according to claim 15 further comprising a clock generator coupled to the controller, the clock generator configured to provide a second clock, the second clock being delayed with respect to the first clock by the delay.

19. The system according to claim 18, wherein the clock generator further comprises a delay unit and a selector, the delay unit being configured to provide the second clock to the selector, and the selector being configured to select from the first clock and the second clock.

20. The system according to claim 19, wherein the delay unit includes a digitally controlled delay line, and the selector includes multiplexers.

* * * * *